(12) United States Patent
Salter et al.

(10) Patent No.: US 8,975,903 B2
(45) Date of Patent: Mar. 10, 2015

(54) PROXIMITY SWITCH HAVING LEARNED SENSITIVITY AND METHOD THEREFOR

(75) Inventors: Stuart C. Salter, White Lake, MI (US); Pietro Buttolo, Dearborn Heights, MI (US); Cornel Lewis Gardner, Romulus, MI (US); Thomas Lee Goodson, Battle Creek, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 606 days.

(21) Appl. No.: 13/157,028

(22) Filed: Jun. 9, 2011

(65) Prior Publication Data

US 2012/0312676 A1    Dec. 13, 2012

(51) Int. Cl.
*G01R 27/26* (2006.01)
*H03K 17/955* (2006.01)

(52) U.S. Cl.
CPC ......... *H03K 17/955* (2013.01); *E05Y 2400/852* (2013.01); *E05Y 2400/86* (2013.01); *H03K 2217/94026* (2013.01); *H03K 2217/960705* (2013.01); *E05Y 2900/50* (2013.01)
USPC ........... 324/681; 324/457; 324/658; 324/679; 324/680; 340/407.02; 345/173

(58) Field of Classification Search
USPC ............. 324/457, 658, 679–690; 340/407.02; 345/173
See application file for complete search history.

(56) References Cited

U.S. PATENT DOCUMENTS

| | | | |
|---|---|---|---|
| 3,382,588 A | 5/1968 | Serrell et al. | |
| 3,544,804 A | 12/1970 | Gaumer et al. | |
| 3,691,396 A | 9/1972 | Hinrichs | |
| 3,707,671 A * | 12/1972 | Morrow et al. | 324/224 |
| 3,826,979 A | 7/1974 | Steinmann | |
| 4,204,204 A | 5/1980 | Pitstick | |
| 4,205,325 A | 5/1980 | Haygood et al. | |
| 4,232,289 A | 11/1980 | Daniel | |
| 4,257,117 A | 3/1981 | Besson | |
| 4,290,052 A | 9/1981 | Eichelberger et al. | |
| 4,340,813 A | 7/1982 | Sauer | |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

"Touch Sensors Design Guide" by ATMEL, 10620 D-AT42-04/09, Revised Apr. 2009, 72 pages, Copyrighted 2008-2009 Atmel Corporation.

(Continued)

*Primary Examiner* — Huy Q Phan
*Assistant Examiner* — Temilade S Rhodes-Vivour
(74) *Attorney, Agent, or Firm* — Vichit Chea; Price Heneveld LLP

(57) ABSTRACT

A vehicle proximity switch and method are provided having learned sensitivity control. The switch includes a proximity sensor, such as a capacitive sensor, installed in a vehicle and providing a sense activation field. Also included is sense control circuitry processing the activation field to sense user activation of the switch by comparing the activation field to a threshold. The switch further includes sensitivity control circuitry learning a user sensitivity based on user activation of a sensor and controlling the sensitivity of one or more proximity switches.

13 Claims, 6 Drawing Sheets

(56) References Cited

U.S. PATENT DOCUMENTS

| | | | |
|---|---|---|---|
| 4,374,381 A | 2/1983 | Ng et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A * | 5/1993 | Panter ............................. 361/181 |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,537,359 B1 | 3/2003 | Spa |
| 6,559,902 B1 | 5/2003 | Kusuda et al. |
| 6,587,097 B1 | 7/2003 | Aufderheide et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |

(56) References Cited

U.S. PATENT DOCUMENTS

| | | | |
|---|---|---|---|
| 7,180,017 B2 | 2/2007 | Hein | |
| 7,186,936 B2 | 3/2007 | Marcus et al. | |
| 7,205,777 B2 | 4/2007 | Schulz et al. | |
| 7,215,529 B2 | 5/2007 | Rosenau | |
| 7,218,498 B2 | 5/2007 | Caldwell | |
| 7,232,973 B2 | 6/2007 | Kaps et al. | |
| 7,242,393 B2 | 7/2007 | Caldwell | |
| 7,245,131 B2 * | 7/2007 | Kurachi et al. | 324/663 |
| 7,248,151 B2 | 7/2007 | Mc Call | |
| 7,248,955 B2 | 7/2007 | Hein et al. | |
| 7,254,775 B2 | 8/2007 | Geaghan et al. | |
| 7,255,622 B2 | 8/2007 | Stevenson et al. | |
| 7,269,484 B2 | 9/2007 | Hein | |
| 7,295,168 B2 | 11/2007 | Saegusa et al. | |
| 7,295,904 B2 | 11/2007 | Kanevsky et al. | |
| 7,339,579 B2 | 3/2008 | Richter et al. | |
| 7,342,485 B2 | 3/2008 | Joehl et al. | |
| 7,355,595 B2 | 4/2008 | Bathiche et al. | |
| 7,361,860 B2 | 4/2008 | Caldwell | |
| 7,385,308 B2 | 6/2008 | Yerdon et al. | |
| 7,445,350 B2 | 11/2008 | Konet et al. | |
| 7,479,788 B2 | 1/2009 | Bolender et al. | |
| 7,489,053 B2 | 2/2009 | Gentile et al. | |
| 7,521,941 B2 | 4/2009 | Ely et al. | |
| 7,521,942 B2 * | 4/2009 | Reynolds | 324/688 |
| 7,531,921 B2 | 5/2009 | Cencur | |
| 7,532,202 B2 | 5/2009 | Roberts | |
| 7,535,131 B1 * | 5/2009 | Safieh, Jr. | 307/134 |
| 7,535,459 B2 | 5/2009 | You et al. | |
| 7,567,240 B2 | 7/2009 | Peterson, Jr. et al. | |
| 7,583,092 B2 | 9/2009 | Reynolds et al. | |
| 7,643,010 B2 | 1/2010 | Westerman et al. | |
| 7,653,883 B2 | 1/2010 | Hotelling et al. | |
| 7,688,080 B2 | 3/2010 | Golovchenko et al. | |
| 7,701,440 B2 | 4/2010 | Harley | |
| 7,705,257 B2 | 4/2010 | Arione et al. | |
| 7,708,120 B2 | 5/2010 | Einbinder | |
| 7,714,846 B1 | 5/2010 | Gray | |
| 7,719,142 B2 | 5/2010 | Hein et al. | |
| 7,728,819 B2 | 6/2010 | Inokawa | |
| 7,737,953 B2 | 6/2010 | Mackey | |
| 7,737,956 B2 | 6/2010 | Hsieh et al. | |
| 7,777,732 B2 | 8/2010 | Herz et al. | |
| 7,782,307 B2 | 8/2010 | Westerman et al. | |
| 7,791,594 B2 | 9/2010 | Dunko | |
| 7,795,882 B2 | 9/2010 | Kirchner et al. | |
| 7,800,590 B2 | 9/2010 | Satoh et al. | |
| 7,821,425 B2 | 10/2010 | Philipp | |
| 7,834,853 B2 | 11/2010 | Finney et al. | |
| 7,839,392 B2 | 11/2010 | Pak et al. | |
| 7,876,310 B2 | 1/2011 | Westerman et al. | |
| 7,881,940 B2 | 2/2011 | Dusterhoff | |
| RE42,199 E | 3/2011 | Caldwell | |
| 7,898,531 B2 | 3/2011 | Bowden et al. | |
| 7,920,131 B2 | 4/2011 | Westerman | |
| 7,924,143 B2 | 4/2011 | Griffin et al. | |
| 7,957,864 B2 | 6/2011 | Lenneman et al. | |
| 7,978,181 B2 | 7/2011 | Westerman | |
| 7,989,752 B2 | 8/2011 | Yokozawa | |
| 8,026,904 B2 | 9/2011 | Westerman | |
| 8,050,876 B2 | 11/2011 | Feen et al. | |
| 8,054,296 B2 | 11/2011 | Land et al. | |
| 8,054,300 B2 | 11/2011 | Bernstein | |
| 8,077,154 B2 | 12/2011 | Emig et al. | |
| 8,090,497 B2 | 1/2012 | Ando | |
| 8,253,425 B2 | 8/2012 | Reynolds et al. | |
| 8,283,800 B2 | 10/2012 | Salter et al. | |
| 8,330,385 B2 | 12/2012 | Salter et al. | |
| 8,339,286 B2 | 12/2012 | Cordeiro | |
| 8,454,181 B2 | 6/2013 | Salter et al. | |
| 8,456,180 B2 * | 6/2013 | Sitarski | 324/679 |
| 8,508,487 B2 | 8/2013 | Schwesig et al. | |
| 8,570,053 B1 * | 10/2013 | Ryshtun et al. | 324/678 |
| 2001/0019228 A1 | 9/2001 | Gremm | |
| 2001/0028558 A1 | 10/2001 | Rapp et al. | |
| 2002/0040266 A1 | 4/2002 | Edgar et al. | |
| 2002/0084721 A1 | 7/2002 | Walczak | |
| 2002/0093786 A1 | 7/2002 | Maser | |
| 2002/0149376 A1 | 10/2002 | Haffner et al. | |
| 2002/0167439 A1 | 11/2002 | Bloch et al. | |
| 2002/0167704 A1 | 11/2002 | Kleinhans et al. | |
| 2003/0002273 A1 | 1/2003 | Anderson, Jr. et al. | |
| 2003/0122554 A1 | 7/2003 | Karray et al. | |
| 2004/0056753 A1 | 3/2004 | Chiang et al. | |
| 2004/0145613 A1 | 7/2004 | Stavely et al. | |
| 2004/0160072 A1 | 8/2004 | Carter et al. | |
| 2004/0160234 A1 * | 8/2004 | Denen et al. | 324/679 |
| 2004/0160713 A1 | 8/2004 | Wei | |
| 2004/0197547 A1 | 10/2004 | Bristow et al. | |
| 2004/0246239 A1 * | 12/2004 | Knowles et al. | 345/177 |
| 2005/0052429 A1 | 3/2005 | Philipp | |
| 2005/0068712 A1 * | 3/2005 | Schulz et al. | 361/287 |
| 2005/0088417 A1 | 4/2005 | Mulligan | |
| 2005/0110769 A1 | 5/2005 | DaCosta et al. | |
| 2005/0137765 A1 | 6/2005 | Hein et al. | |
| 2005/0242923 A1 | 11/2005 | Pearson et al. | |
| 2006/0038793 A1 | 2/2006 | Philipp | |
| 2006/0044800 A1 | 3/2006 | Reime | |
| 2006/0082545 A1 | 4/2006 | Choquet et al. | |
| 2006/0238518 A1 * | 10/2006 | Westerman et al. | 345/173 |
| 2006/0238521 A1 * | 10/2006 | Westerman et al. | 345/173 |
| 2006/0244733 A1 | 11/2006 | Geaghan | |
| 2006/0262549 A1 | 11/2006 | Schmidt et al. | |
| 2006/0267953 A1 | 11/2006 | Peterson, Jr. et al. | |
| 2006/0279015 A1 | 12/2006 | Wang | |
| 2006/0287474 A1 | 12/2006 | Crawford et al. | |
| 2007/0008726 A1 | 1/2007 | Brown | |
| 2007/0023265 A1 | 2/2007 | Ishikawa et al. | |
| 2007/0051609 A1 | 3/2007 | Parkinson | |
| 2007/0068790 A1 | 3/2007 | Yerdon et al. | |
| 2007/0096565 A1 | 5/2007 | Breed et al. | |
| 2007/0103431 A1 | 5/2007 | Tabatowski-Bush | |
| 2007/0226994 A1 | 10/2007 | Wollach et al. | |
| 2007/0232779 A1 | 10/2007 | Moody et al. | |
| 2007/0247429 A1 | 10/2007 | Westerman | |
| 2007/0255468 A1 | 11/2007 | Strebel et al. | |
| 2007/0257891 A1 | 11/2007 | Esenther et al. | |
| 2007/0296709 A1 | 12/2007 | GuangHai | |
| 2008/0012835 A1 | 1/2008 | Rimon et al. | |
| 2008/0018604 A1 | 1/2008 | Paun et al. | |
| 2008/0023715 A1 | 1/2008 | Choi | |
| 2008/0030465 A1 | 2/2008 | Konet et al. | |
| 2008/0111714 A1 | 5/2008 | Kremin | |
| 2008/0136792 A1 | 6/2008 | Peng et al. | |
| 2008/0143681 A1 | 6/2008 | XiaoPing | |
| 2008/0150905 A1 | 6/2008 | Grivna et al. | |
| 2008/0158146 A1 | 7/2008 | Westerman | |
| 2008/0196945 A1 | 8/2008 | Konstas | |
| 2008/0202912 A1 | 8/2008 | Boddie et al. | |
| 2008/0231290 A1 | 9/2008 | Zhitomirsky | |
| 2008/0238650 A1 | 10/2008 | Riihimaki et al. | |
| 2008/0257706 A1 | 10/2008 | Haag | |
| 2008/0272623 A1 | 11/2008 | Kadzban et al. | |
| 2009/0066659 A1 | 3/2009 | He et al. | |
| 2009/0079699 A1 | 3/2009 | Sun | |
| 2009/0108985 A1 | 4/2009 | Haag et al. | |
| 2009/0115731 A1 | 5/2009 | Rak | |
| 2009/0120697 A1 | 5/2009 | Wilner et al. | |
| 2009/0135157 A1 | 5/2009 | Harley | |
| 2009/0225043 A1 | 9/2009 | Rosener | |
| 2009/0235588 A1 | 9/2009 | Patterson et al. | |
| 2009/0236210 A1 | 9/2009 | Clark et al. | |
| 2009/0251435 A1 | 10/2009 | Westerman et al. | |
| 2009/0273563 A1 * | 11/2009 | Pryor | 345/157 |
| 2009/0309616 A1 | 12/2009 | Klinghult et al. | |
| 2010/0001974 A1 | 1/2010 | Su et al. | |
| 2010/0007613 A1 | 1/2010 | Costa | |
| 2010/0007620 A1 | 1/2010 | Hsieh et al. | |
| 2010/0013777 A1 | 1/2010 | Baudisch et al. | |
| 2010/0026654 A1 | 2/2010 | Suddreth | |
| 2010/0039392 A1 | 2/2010 | Pratt et al. | |
| 2010/0090712 A1 | 4/2010 | VAndermeijden | |
| 2010/0090966 A1 | 4/2010 | Gregorio | |
| 2010/0102830 A1 | 4/2010 | Curtis et al. | |

(56) References Cited

U.S. PATENT DOCUMENTS

| | | |
|---|---|---|
| 2010/0103139 A1 | 4/2010 | Soo et al. |
| 2010/0110037 A1 | 5/2010 | Huang et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0214253 A1 | 8/2010 | Wu et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0169758 A1 | 7/2011 | Aono |
| 2011/0187492 A1 | 8/2011 | Newman et al. |
| 2011/0279276 A1 | 11/2011 | Newham |
| 2011/0279409 A1 | 11/2011 | Salaverry et al. |
| 2012/0007821 A1 | 1/2012 | Zaliva |
| 2012/0037485 A1 | 2/2012 | Sitarski |
| 2012/0043973 A1* | 2/2012 | Kremin ............... 324/658 |
| 2012/0043976 A1 | 2/2012 | Bokma et al. |
| 2012/0049870 A1 | 3/2012 | Salter et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0154324 A1 | 6/2012 | Wright et al. |
| 2012/0313648 A1 | 12/2012 | Salter et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0113397 A1 | 5/2013 | Salter et al. |
| 2013/0113544 A1 | 5/2013 | Salter et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| GB | 2071338 | 9/1981 |
| GB | 2158737 | 11/1985 |
| GB | 2279750 A1 | 1/1995 |
| GB | 2418741 | 4/2006 |
| GB | 2409578 | 6/2008 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 A2 | 2/2007 |
| JP | 2008033701 A | 2/2008 |
| JP | 2010139362 A | 6/2010 |
| JP | 2010165618 A | 7/2010 |
| JP | 2010218422 | 9/2010 |
| JP | 2010239587 | 10/2010 |
| JP | 2010287148 A | 12/2010 |
| JP | 2011014280 A | 8/2011 |
| KR | 20040110463 | 12/2004 |
| KR | 20090127544 | 12/2009 |
| KR | 20100114768 | 10/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 A1 | 4/2009 |
| WO | 201011362 A1 | 9/2010 |
| WO | 2012032318 | 3/2012 |
| WO | 2012169106 | 12/2012 |

OTHER PUBLICATIONS

NXP Capacitive Sensors, 1 page, www.nxp.com, copyrighted 2006-2010, NXP Semiconductors.

Densitron Displays, Introduction to Touch Solutions, White Paper, Revision 1.0 A, 14 pages, Aug. 21, 2007.

"Charge-Transfer Sensing-Based Touch Controls Facilitate Creative Interfaces," www.ferret.com.au, 2 pages, Jan. 18, 2006.

U.S. Appl. No. 13/489,731, filed Jun. 6, 2012, 30 pages and related filing receipt (3 pages).

Van Ess, Dave et al., "Capacitive Touch Switches for Automotive Applications," 7 pages, Published in Automotive DesignLine, www.automotiedesignline.com, Feb. 2006.

(56) References Cited

OTHER PUBLICATIONS

"Clevios P Formulation Guide," 12 pages, www.clevios.com, Heraeus Clevios GmbH, no date provided.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

"Orgacon EL-P3000, Screen printing Ink Series 3000," 2 pages, AGFA, last updated in Feb. 2006.

"Moisture Immunity in QuickSense Studio," AN552, Rev. 0.1 10/10, 8 pages, Silicon Laboratories, Inc., © 2010.

* cited by examiner

PROXIMITY SWITCH HAVING LEARNED SENSITIVITY AND METHOD THEREFOR

FIELD OF THE INVENTION

The present invention generally relates to switches, and more particularly relates to proximity switches with enhanced sensitivity control.

BACKGROUND OF THE INVENTION

Automotive vehicles are typically equipped with various user actuated switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch typically caused by a user's finger in close proximity or contact with the sensor. Proximity switches are typically configured to detect user actuation of the switch based on comparison of the sense activation field to a threshold. Unfortunately, different users often have different size fingers, different length finger nails, different actuation techniques, and may wear gloves exhibiting different dielectric properties, all of which may affect the results of the comparison of the actuation field to the threshold value which may result in different actuation detection levels. It is desirable to provide for an enhanced proximity switch that allows for such variations in use.

SUMMARY OF THE INVENTION

According to one aspect of the present invention, a proximity switch having learned sensitivity control is provided. The proximity switch includes one or more proximity sensors providing a sense activation field. The proximity switch also includes sense control circuitry processing the activation field to sense user activation of the switch by comparing the sense activation field to a threshold. The proximity switch further includes sensitivity control circuitry learning user sensitivity based on user activation of a sensitivity sensor and controlling sensitivity of the switch based on the learned user sensitivity.

According to another aspect of the present invention, a vehicle capacitive switch having learned sensitivity control is provided. The capacitive switch includes a capacitive sensor installed in a vehicle and providing a sense activation field. The capacitive switch also includes sense control circuitry processing the activation field to sense user activation of the switch by comparing the activation field to a threshold. The capacitive switch further includes sensitivity control circuitry learning user sensitivity based on user activation of a sensitivity sensor and controlling the sensitivity of the capacitive switch based on the learned user sensitivity.

According to a further aspect of the present invention, a method of sensing user proximity with learned sensitivity control is provided. The method includes the steps of providing a sense activation field with a proximity sensor and processing the sense activation field to sense user activation of the proximity sensor by comparing the sense activation field to a threshold. The method further includes the steps of learning user sensitivity based on activation of a sensitivity sensor and adjusting sensitivity of the proximity sensor based on the learned user sensitivity.

These and other aspects, objects, and features of the present invention will be understood and appreciated by those skilled in the art upon studying the following specification, claims, and appended drawings.

DETAILED DESCRIPTION OF PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
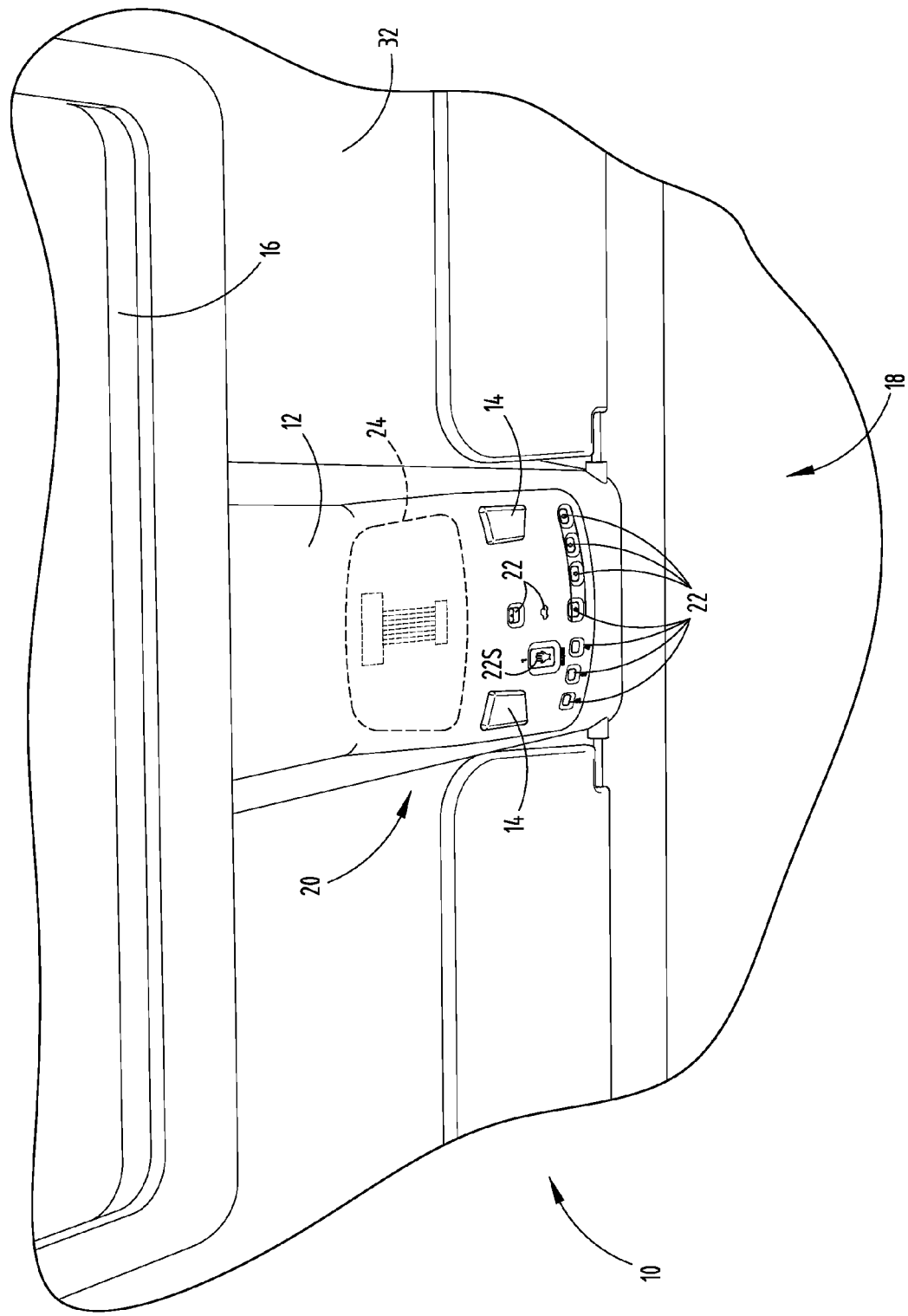
FIG. 1 is a perspective view of a passenger compartment of an automotive vehicle having an overhead console employing proximity switches having learned sensitivity control, according to one embodiment.
Figure 2:
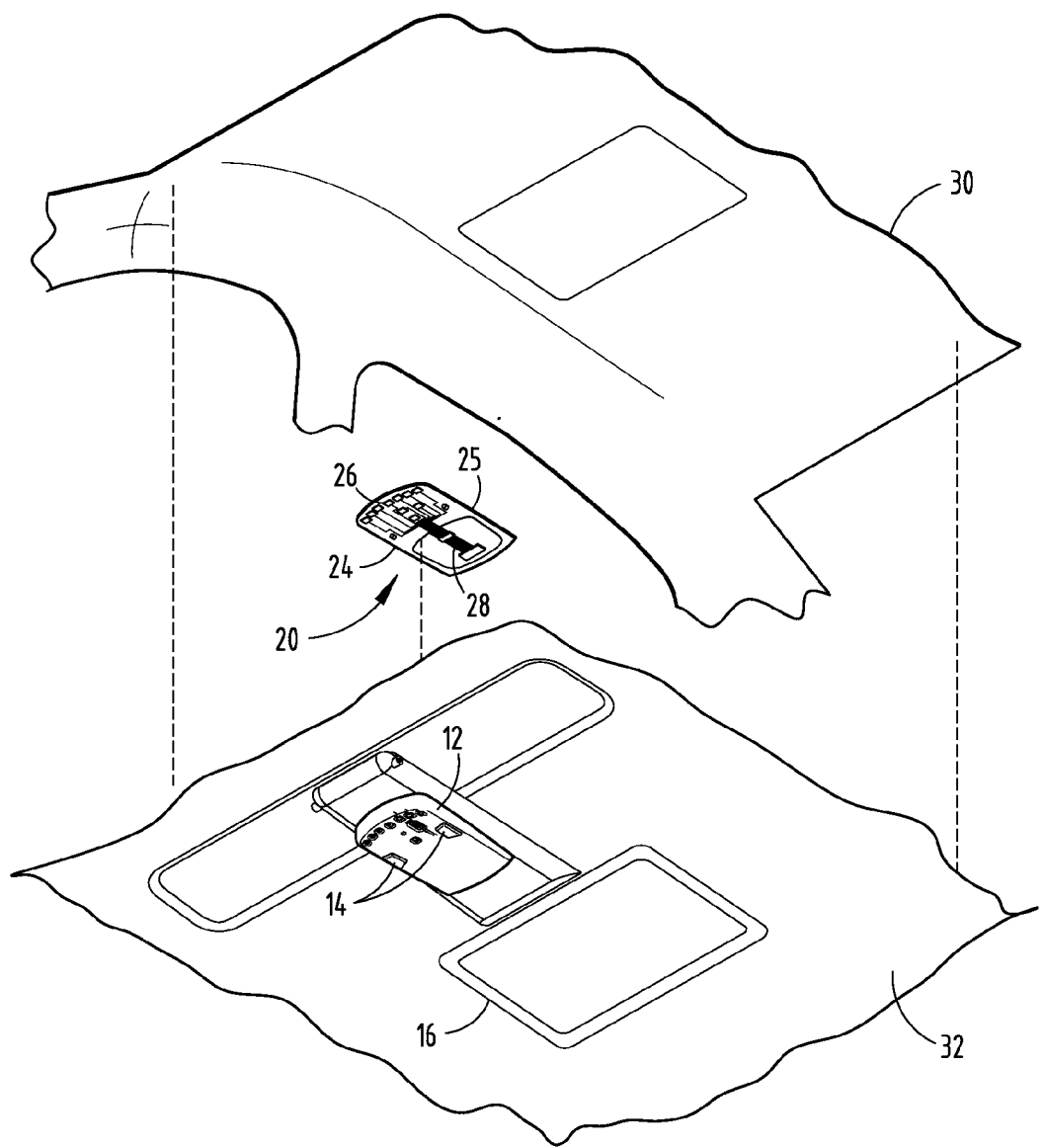
FIG. 2 is an exploded view of the overhead console within the headliner further illustrating the proximity switches shown in FIG. 1.

Referring to FIGS. 1 and 2, the interior of an automotive vehicle 10 is generally illustrated having a passenger compartment 18 and a switch assembly 20 employing a plurality of proximity switches 22 having learned sensitivity control, according to one embodiment. The vehicle 10 generally includes an overhead console 12 assembled to the headliner 32 on the underside of the roof 30 or ceiling at the top of the passenger compartment 18, generally above the front passenger seating area. The switch assembly 20 having proximity switches 22 with sensitivity control is provided in the overhead console 12, according to one embodiment. The various proximity switches 22 may control any of a number of vehicle devices and functions, such as controlling movement of a sunroof or moonroof 16, activation of one or more lighting devices such as interior map/reading and dome lights 14, and various other devices and functions. However, it should be appreciated that the proximity switches 22 and sensitivity control user input may be located elsewhere on the vehicle 10, such as in the dash panel, on other consoles such as a center console, integrated into a touch screen display for a radio or infotainment system such as navigation and audio display, or located elsewhere onboard the vehicle 10.

The proximity switches 22 are shown and described herein as capacitive switches, according to one embodiment. Each proximity switch 22 includes at least one proximity sensor that provides a sense activation field to sense contact or close proximity of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIG. 1 each provide control of a vehicle component or device or provide a designated control function. One or more of the proximity switches 22 may be dedicated to controlling movement of a sunroof or moonroof 16 so as to cause the moonroof to move in an open or closed direction, tilt the moonroof, or stop movement of the moonroof based upon a control algorithm. Other proximity switches 22 may be dedicated to control other devices, such as turning an interior map/reading light on, turning a map/reading light off, turning a dome lamp on or off, unlocking a trunk, opening a rear hatch, or for defeating a door light switch. Additional controls via the proximity switches may include actuating door power windows up and down. Various other vehicle controls may be controlled by way of the proximity switches 22 described herein.

Additionally, a sensitivity sensor input 22S is provided to allow a user to initiate a sensitivity learning process that learns and controls the sensitivity of the various proximity switches 22. In one embodiment, the sensitivity sensor input 22S is a capacitive sensor implemented as a proximity switch, such as a capacitive switch, according to one embodiment. By actuating the sensitivity sensor input 22S as described herein, the sensitivity learning process is initiated to learn the sensitivity of a user's actuation and the sensitivity of the various proximity switches 22 is adjusted based on the learned sensitivity. Thus, users, such as users wearing gloves on their hands and fingers, may initiate the sensitivity learning process to change the sensitivity of the proximity switches 22 so as to increase the sensitivity to accommodate the use of the glove on the hand and finger or decrease the sensitivity when no glove is present. The sensitivity learning process may also be used to change the sensitivity to accommodate differences among the users' fingers, finger nail sizes, and swipe techniques such as distance from the finger to the proximity switch 22 during a swiping input motion. The electrical conductivity of users' fingers may vary among users which results in different changes or disturbances to the sense activation field. The sensitivity learning process advantageously adjusts the sensitivity to compensate for these variations in use.

In the capacitive sensor embodiment, the proximity switches 22 and sensitivity sensor input 22S each include capacitive plates or electrode pads which are formed as part of the capacitor and electronic circuitry 24. Electrical signals are applied to each of the capacitive switches 22 and the sensitivity sensor input 22S. According to one embodiment, the electronic circuitry 24 provides electrical signals having a burst length to charge the capacitive sensors. The charge burst length determines the base amplitude of the sense activation field and the sensitivity of the corresponding proximity switches 22. By changing the charge burst length of the applied electrical signal, the sensitivity of each proximity switch 22 can be changed, according to one embodiment. According to another embodiment, the comparison threshold value can be changed to change the sensitivity of each of the proximity switches 22.

The switch assembly 20 has the capacitor and electronic circuitry 24 as shown in FIG. 2 which includes capacitive plates/pads 26 and lead lines 28 formed onto a circuit board 25. The circuit board 25 is assembled into the overhead console 12. The overhead console 12 is sandwiched between the roof 30 and the headliner 32 such that the overhead console 12 extends from the headliner 32.

Figure 3:
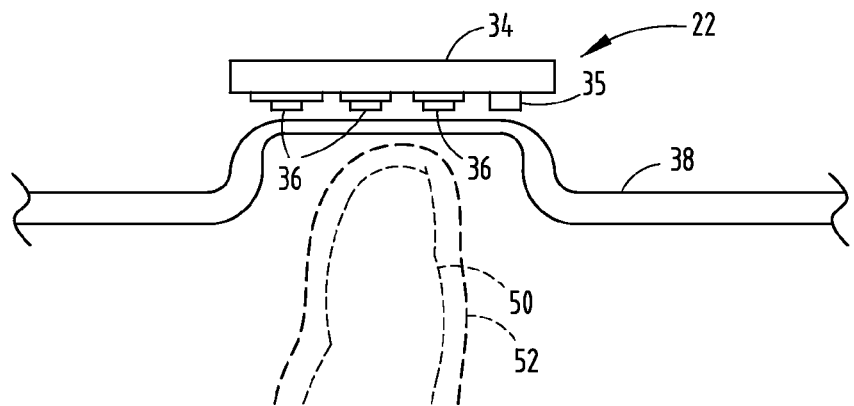
FIG. 3 is a cross-sectional view taken through III-III of FIG. 1 further illustrating a proximity sensor, such as the learned sensitivity sensor input, in relation to a gloved finger.
Figure 4:
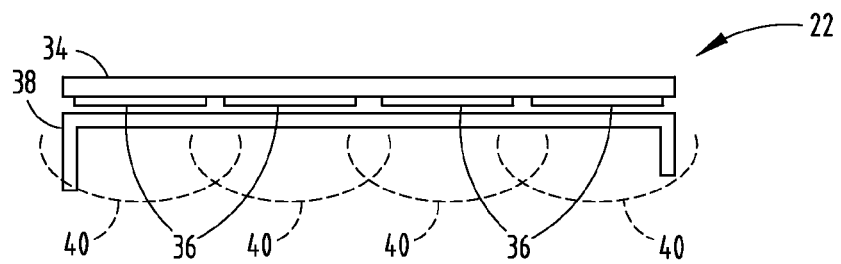
FIG. 4 is a cross-sectional view taken through a proximity sensor having multiple overlapping sense activation fields, according to one embodiment.
Figure 5:
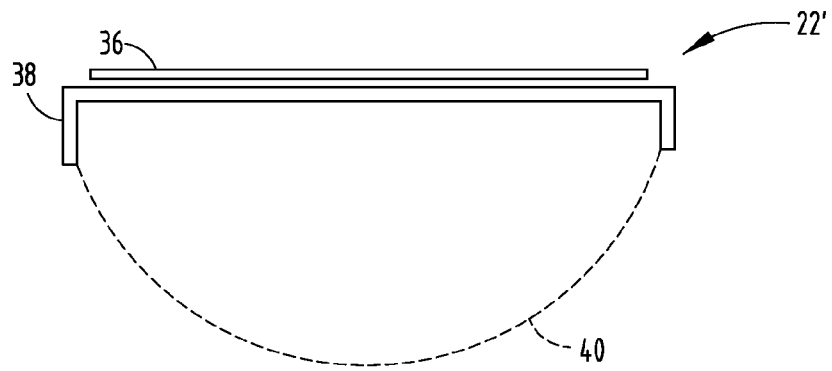
FIG. 5 is a cross-sectional view taken through a proximity sensor having a single sense activation field, according to another embodiment.

Examples of capacitive proximity switch sensors are illustrated in FIGS. 3-5. In FIG. 3, a finger 50 of a user wearing a glove 52 is illustrated actuating a proximity switch 22 with the gloved finger, according to one embodiment. Actuation of the proximity switch 22 may be achieved by a swiping motion of the user's finger which may contact an outer surface of the sensor housing or may be sufficiently close to the switch 22 such that the finger passes through the sense activation field. In one embodiment, activation of any of the proximity switches 36 can cause a device to perform a designated function. For example, activation of a proximity switch can cause the moonroof to move in an open or closed direction, or stop movement of the moonroof based upon a control routine. According to another embodiment, each of a plurality of sensors or arrays of sensors may be activated to provide individual control functions such that one array of sensors may open the moonroof, another array of sensors may close the moonroof, and a further array of sensors may tilt the moonroof. In addition, the proximity switches 22 may include one or more light sources 35 that backlight the circuit board 34 or emit light between the circuit board 34 and the console surface, such that the emitted light is viewed through the console surface of the switch.

The proximity switch 22 shown in FIG. 4 has a circuit board substrate 34 and a plurality of sensors 36 that generate an activation field. In this embodiment, a plurality of overlapping sense activation fields 40 is generated by a plurality of capacitive sensors 36. It should be appreciated that the overall activation field 40 may have a rectangular shape formed by the individual arch-shaped fields 40.

According to another embodiment, a single capacitive sensor arrangement 36 may be employed to create a single activation field 40 as shown in FIG. 5. The single activation field may have a generally arch-shaped field in a generally rectangular or circular area. It should be appreciated that any number of capacitive sensors forming any number of activation fields may be employed to sense activation of the proximity switch 22.

Figure 6:
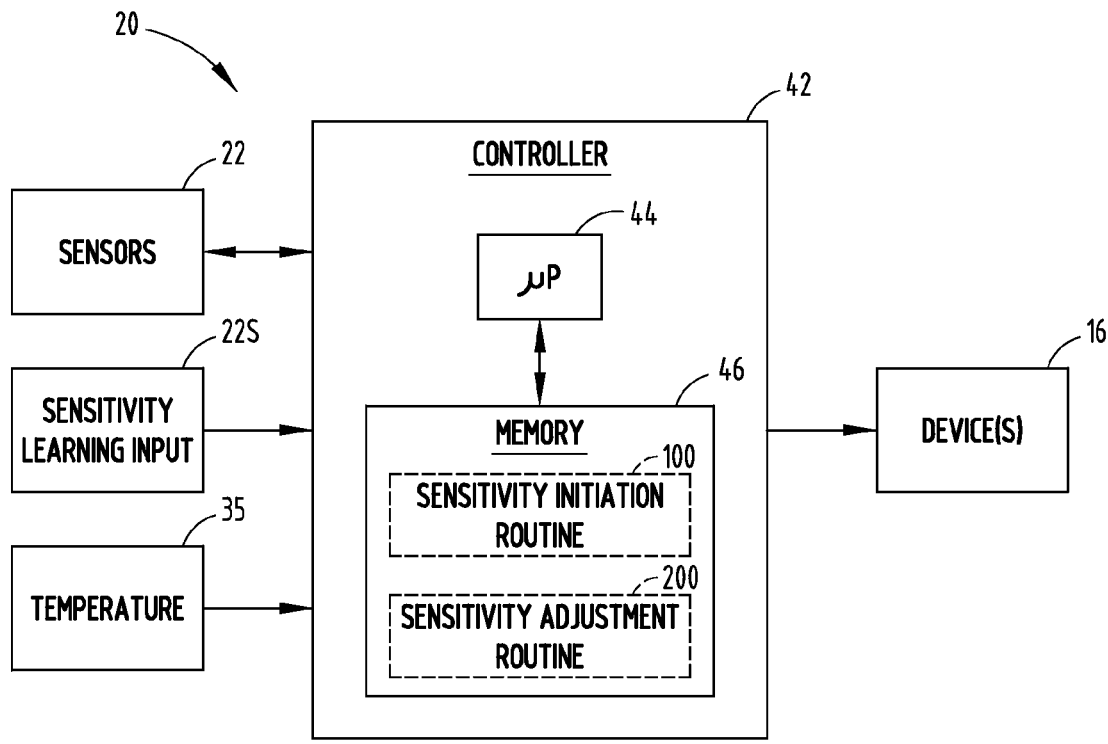
FIG. 6 is a block diagram illustrating the proximity switch assembly having learned sensitivity control, according to one embodiment.

Referring to FIG. 6, the proximity switch assembly 20 is illustrated according to one embodiment. One or more of proximity switches 22 are shown providing inputs to a controller 42. Additionally, the sensitivity sensor input 22S provides an input to the controller 42. The controller 42 may include control circuitry, such as a microprocessor 44 and memory 46. The control circuitry may include sense control circuitry processing the activation field to sense user activation of the switch by comparing the activation field to a threshold, and sensitivity control circuitry learning a user sensitivity based on user activation of a switch and controlling the sensitivity of the proximity switches based on the learned sensitivity. It should be appreciated that other analog and/or digital control circuitry may be employed to process the activation field, learn user sensitivity, and control sensitivity of the proximity sensors.

The controller 42 processes one or more routines including sensitivity initiation routine 100 and sensitivity adjustment routine 200 stored in memory 46 executable by the microprocessor 44 based upon the inputs of one or more of proximity switches 22 and sensitivity sensor input 22S. It should be appreciated that the controller 42 may adjust the sensitivity of the proximity switch 22 based upon a learned sensitivity which is learned following an initiation process whereby a user may actuate the sensitivity sensor input 22S pursuant to a predetermined protocol. The sensitivity of each proximity switch 22 is adjusted based on the learned sensitivity and used to detect actuation by one or more users.

The controller 42 further provides control outputs to one or more devices 16 so as to control the devices based on user activation of one or more of the proximity switches 22. For example, the moonroof may be controlled to open or close based on activation of a switch 22. In doing so, the output may be generated when the sense activation field exceeds a threshold value.

The controller 42 is further shown receiving a temperature input 35 from a temperature sensor which measures the temperature of the environment in which the proximity switches 22 are employed, such as the passenger compartment of the vehicle 10. The controller 42 may control the sensitivity of the proximity sensors based on the sensed temperature. According to one embodiment, the sensitivity of the proximity sensors may be increased when the sensed temperature decreases and sensitivity may be decreased when the sensed temperature increases. Accordingly, changes in temperature that may affect sensitivity of the proximity switches 42 is thereby compensated for.

In the embodiment shown, a separate and distinct sensitivity sensor input 22S is shown and described herein for receiving a user input to initiate the sensitivity learning process and to learn a sensitivity setting for the proximity switches 22. The sensitivity sensor input 22S may include a dedicated proximity switch, such as a capacitive switch, according to one embodiment. According to another embodiment, the sensitivity input may be a shared switch that performs one or more control functions and also receives a sensitivity input pursuant to a predetermined protocol. For example, a proximity switch 22 that performs a function, such as opening or closing a moonroof, may also serve as the sensitivity sensor input whereby a user provides inputs pursuant to a technique such as tapping on the proximity switch 22 a predetermined number of times or holding a finger on the proximity switch 22 for a minimum time period to cause the switch 22 to enter a sensitivity input mode. Once in a sensitivity input mode, the switch can be actuated to initiate sensitivity learning and to learn sensitivity of a user such that the sensitivity of all of the proximity switches 22 can be adjusted accordingly.

Figure 7:
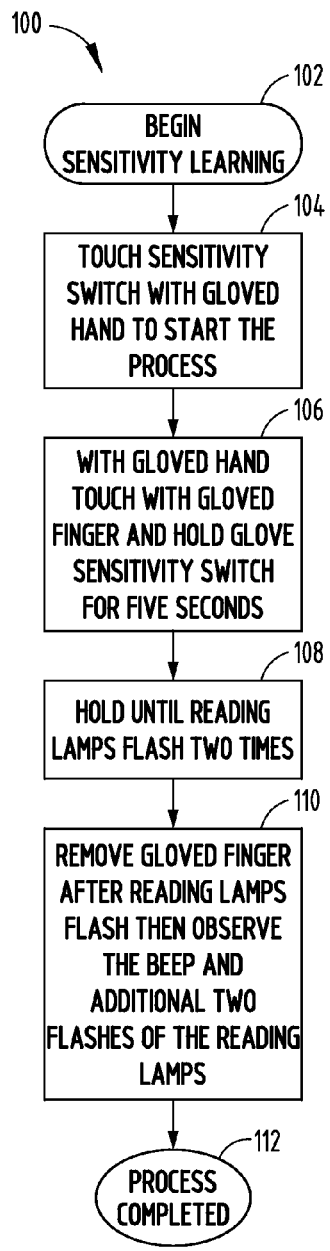
FIG. 7 is a flow diagram illustrating a routine for initiating sensitivity learning, according to a first embodiment.

Referring to FIG. 7, a sensitivity initiation routine 100 is illustrated for initiating the sensitivity learning and control process, according to a first embodiment. The sensitivity initiation routine 100 is described in connection with a user wearing a glove on the hand, however, it should be appreciated that the sensitivity learning and control is also applicable to a non-gloved hand. In this embodiment, sensitivity initiation routine 100 begins at step 102 and proceeds to step 104 in which a user's gloved hand touches the sensitivity input sensor to start the sensitivity learning and control process. At step 106, with the gloved hand, the user touches the gloved finger and holds the gloved sensitivity switch for a predetermined time period, such as five seconds. At step 108, the user continues to touch the sensitivity sensor until the reading lamps 14 flash a predetermined number of times, such as two times. At step 110, the user removes the gloved finger from the sensitivity sensor after the reading lamps flash and then observes an audible beep and two additional flashes of the reading lamp 14. Once the learning process is initiated, the sensitivity adjustment routine 200 measures the user's sensitivity to learn a sensitivity setting that is to be used to control sensitivity of the proximity switches. The sensitivity learning process 100 is completed at step 112.

Figure 8:
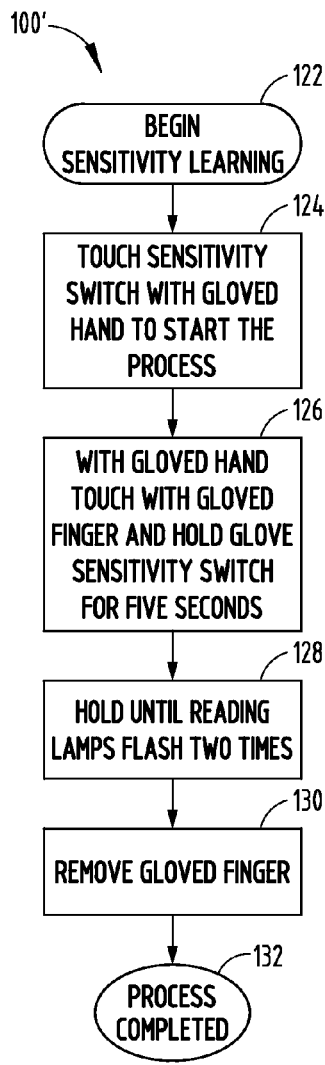
FIG. 8 is a flow diagram illustrating a routine for initiating sensitivity learning, according to a second embodiment.

Referring to FIG. 8, a sensitivity initiation routine 100' is illustrated in connection with the use of a user's gloved hand, according to a second embodiment. In this embodiment, routine 100' begins at step 102 and proceeds to step 124 in which a user touches the sensitivity sensor with the gloved hand to start the process. Next, at step 126, with the gloved hand, the user touches the sensitivity sensor with the gloved finger and holds the sensitivity switch for a predetermined period of time, such as five seconds. In step 128, the user continues to hold the sensitivity sensor until the reading lamp 14 flashes a predetermined number of times, such as two times. During steps 126 and 128, the sensitivity adjustment routine 200 learns the sensitivity of the user and adjusts the sensitivity of the proximity switches. The user may then remove the gloved finger from the sensitivity sensor at step 130 and the sensitivity initiation routine process is completed at step 132.

Figure 9:
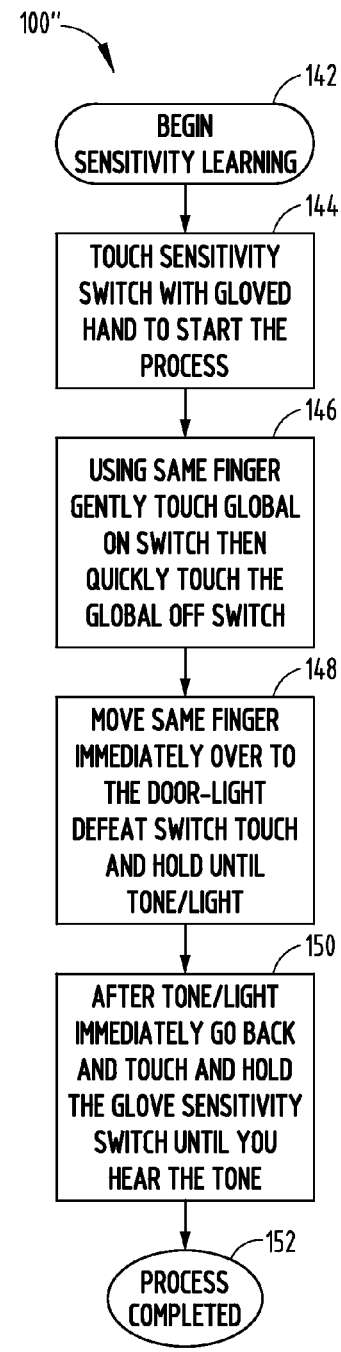
FIG. 9 is a flow diagram illustrating a routine for initiating sensitivity learning, according to a third embodiment.

Referring to FIG. 9, a sensitivity initiation routine 100" is illustrated in connection with the use of a user's gloved hand, according to a third embodiment. In this embodiment, routine 100" begins at step 142 and proceeds to step 144 which a user touches the sensitivity sensor with the gloved hand to start the process. Next, at step 146, the user, using the same finger, gently touches a first proximity switch shown as the global on switch, and then quickly touches a second proximity switch shown as the global off switch, in sequence. At step 148, the user moves the same finger immediately over to a third proximity switch shown as the door-light defeat proximity switch and touches and holds the third switch until an audible tone and/or visible light output is presented. After the audible tone and/or light output, the user goes back and touches and holds the sensitivity sensor until an audible tone is output at step 150, and completes the process at step 152. In this embodiment, a dedicated proximity switch, such as the door-light defeat proximity switch, is employed for sensing the sensitivity of the user, and the learned sensitivity value is used to control all proximity switches.

Figure 10:
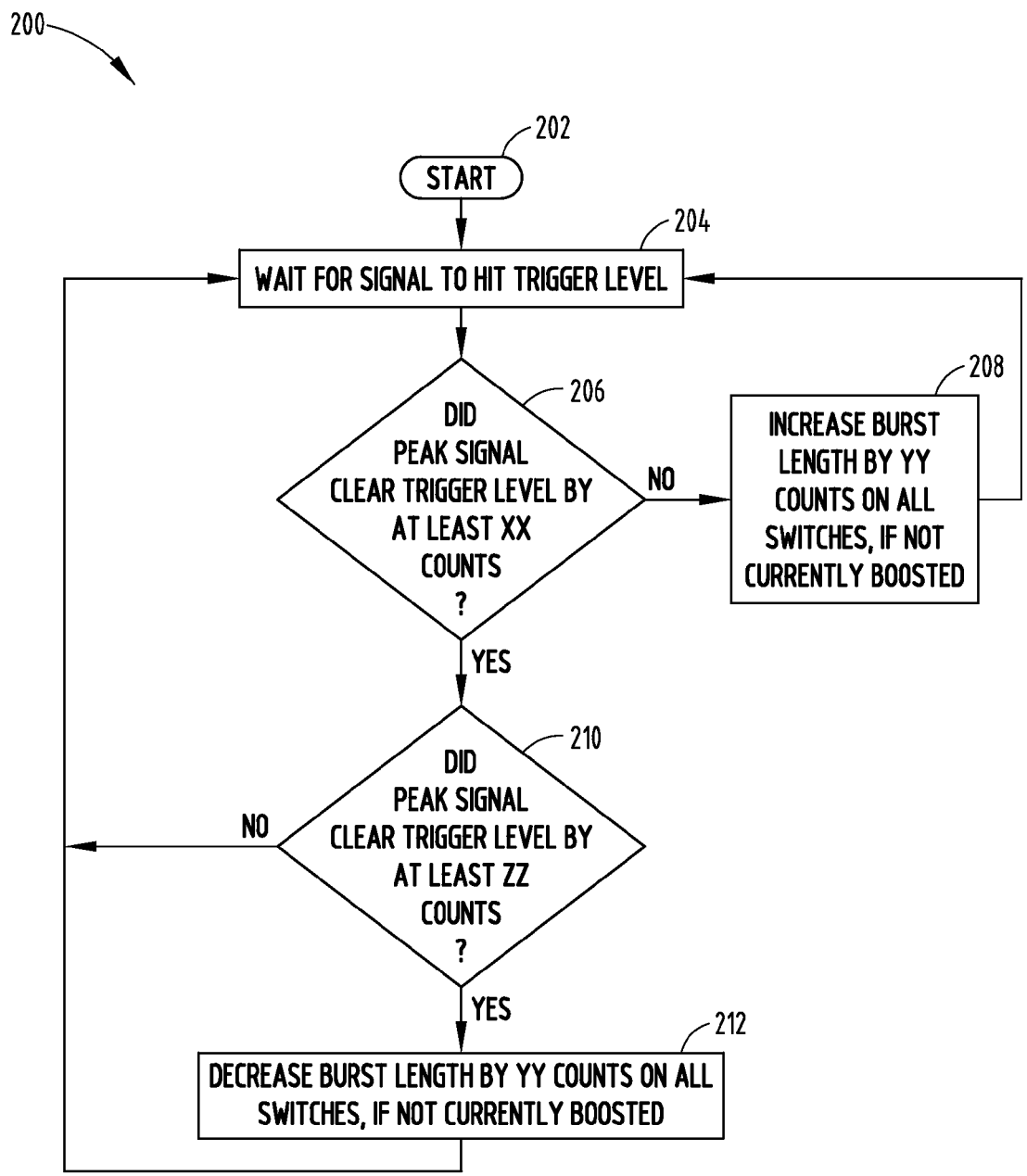
FIG. 10 is a flow diagram illustrating a routine for adjusting sensitivity of one or more proximity switches, according to one embodiment.
Figure 11:
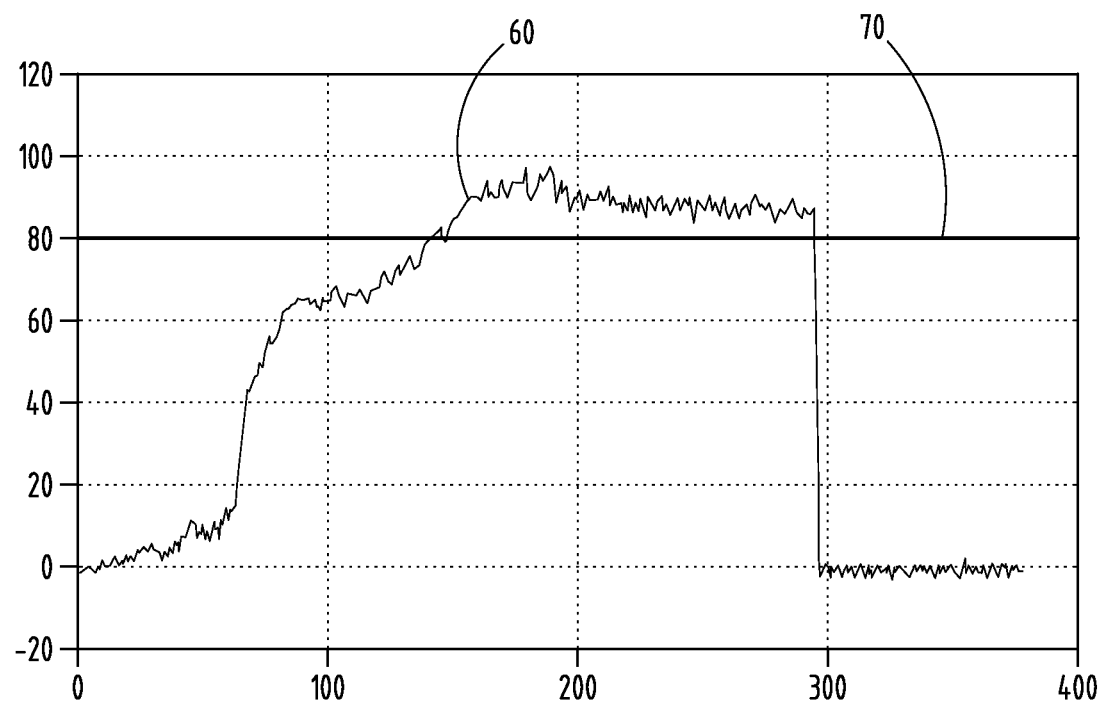
FIG. 11 is a graph illustrating a comparison of the sense activation field to a learned sensitivity threshold.

Referring to FIG. 10, the sensitivity adjustment routine 200 is illustrated for learning the sensitivity of a user and adjusting the sensitivity of the proximity switches based on the learned user sensitivity, according to one embodiment. Routine 200 begins at step 202 and proceeds to step 204 to wait for the activation signal to hit a trigger level. At decision step 206, routine 200 determines if the peak signal exceeds (clears) a trigger level by at least a predetermined count value XX counts and, if not, increases the burst length by a count value YY on all proximity switches, if not currently boosted at step 208. If the peak signal exceeds the trigger value by at least the count value XX, routine 200 proceeds to decision step 210 to determine if the peak signal exceeds (clears) the trigger level by at least a count value ZZ and, if so, decreases the burst value by a count value YY on all proximity switches, if not currently boosted.

According to one example, the sensitivity adjustment routine 200 may employ a trigger level value of 20 counts and may compare the peak signal to a predetermined count value XX of 10 counts to determine if the peak signal exceeded the trigger level by the 10 counts and, if so, increase the burst length by a count value YY of 10 counts. In this example, the peak signal may be compared to a predetermined count value ZZ of 150 counts and if the peak signal exceeds the trigger value by the 150 counts, the burst length is decreased by a count value YY of 10 counts. The above count values are merely examples, as any designated value may be employed to adjust the sensitivity of the proximity switches.

According to one embodiment, the learned sensitivity is used to adjust sensitivity of the proximity switches based on three levels of sensitivity, indicated by count values less than XX, count values between XX and ZZ, and count values greater than ZZ. The adjustment of the sensitivity may be implemented via incremental changes in sensitivity among a select number of two or more settings, such as three levels of sensitivity (e.g., low, medium and high). It should be appreciated that sensitivity of the proximity switches may be adjusted based on any number of two or more sensitivity settings. The sensitivity of the proximity switches 22 may be adjusted by changing the charge burst length of electrical signals applied to each of the proximity switches, according to one embodiment. According to another embodiment, the threshold value used in the comparison may be adjusted to change the sensitivity of the proximity switches 22.

Referring to FIG. 8, a sense activation field 60 is illustrated in comparison to a threshold value 70. When the sense activation field 60 exceeds the threshold value 70, actuation of the proximity switch is detected. Sensitivity of a user may be learned and used to change the sensitivity of the proximity switches so as to change the threshold value 70 to a lower threshold to increase the sensitivity or may increase the threshold value 70 to decrease the sensitivity, according to one embodiment. Alternately, the order of magnitude of the activation signal 60 may be changed to increase or decrease signal 60 by changing the charge burst length so as to adjust the sensitivity of the proximity switches.

Accordingly, the proximity switch arrangement advantageously provides for learned user adjustment of the sensitivity of proximity switches 22 provided onboard a vehicle 10. By learning and adjusting the sensitivity of the proximity switches 22 via the learned sensitivity, an enhanced sensitivity of the detection of an activating finger may be realized to accommodate for the user of a glove worn over the user's finger. Additionally, changes to sensitivity may accommodate other variations in the activation by a user, such as different length fingers, differing lengths of user fingernails which may cause the finger to be more distant from the sensor, or a particular swipe motion technique used by the user.

It is to be understood that variations and modifications can be made on the aforementioned structure without departing from the concepts of the present invention, and further it is to be understood that such concepts are intended to be covered by the following claims unless these claims by their language expressly state otherwise.

We claim:
1. A proximity switch having learned sensitivity control comprising:
one or more proximity sensors providing a sense activation field;
sense control circuitry processing the activation field to sense user activation of the switch by comparing the activation field to a threshold;
a dedicated sensitivity capacitive sensor; and
sensitivity control circuitry sensing use of a glove on the user, learning user sensitivity based on user activation of the sensitivity capacitive sensor and controlling the sensitivity of the switch based on the learned user sensitivity, wherein the one or more proximity sensors each comprises a capacitive sensor, wherein the sensitivity of the switch is controlled by adjusting burst length of a signal applied to the capacitive sensor, wherein the burst length is increased when a peak signal associated with the activation field exceeds the threshold by less than a first count value, and wherein the burst length is decreased when the peak signal exceeds the threshold by at least a second count value.

2. The proximity switch of claim 1, wherein the proximity switch is installed in a vehicle for use by a passenger in the vehicle.

3. The proximity switch of claim 1, wherein the sensitivity control circuitry performs a learning routine upon activation of the sensor.

4. The proximity switch of claim 1 further comprising a temperature sensor sensing temperature, wherein the sensitivity of the proximity switch is further controlled based on the sensed temperature.

5. The proximity switch of claim 1 further comprising an output for providing an output signal to control a device.

6. The proximity switch of claim 1, wherein the dedicated sensitivity capacitive sensor is separate from the one or more proximity sensors.

7. A vehicle capacitive switch having learned sensitivity control comprising:
a capacitive sensor installed in a vehicle and providing a sense activation field;
sense control circuitry processing the activation field to sense user activation of the switch by comparing the activation field to a threshold; and
sensitivity control circuitry sensing use of a glove on the user, learning user sensitivity based on user activation of a sensitivity capacitive sensor and adjusting burst length of a signal applied to the capacitive sensor to control sensitivity of the capacitive switch based on the learned user sensitivity, wherein the burst length is increased when a peak signal associated with the activation field exceeds the threshold by less than a first count value, and wherein the burst length is decreased when the peak signal exceeds the threshold by at least a second count value.

8. The capacitive switch of claim 7 further comprising an output for providing an output signal to a control device.

9. The capacitive switch of claim 7, wherein the sensitivity sensor comprises a dedicated sensitivity sensor that is separate from the capacitive sensor.

10. A method of sensing user proximity with learned sensitivity control, said method comprising:
providing a sense activation field with a proximity sensor;
processing the sense activation field to sense user activation of the proximity sensor by comparing the sense activation field to a threshold;
sensing use of a glove on the user;
learning user sensitivity based on activation of a dedicated sensitivity capacitive sensor that is separate from the proximity sensor; and
adjusting sensitivity of the proximity sensor based on the learned user sensitivity, wherein the proximity sensor comprises a capacitive sensor, wherein the sensitivity is adjusted by controlling burst length of an electrical signal applied to the capacitive sensor, and wherein the burst length is increased when a peak signal associated with the activation field exceeds the threshold by less than a first count value, and wherein the burst length is decreased when the peak signal exceeds the threshold by at least a second count value.

11. The method of claim 10, wherein the proximity sensor is installed in a vehicle for use by a passenger in the vehicle.

12. The method of claim 10, wherein a learning routine is executed by control circuitry upon activation of the sensitivity sensor.

13. The method of claim 10 further comprising a step of outputting a control signal based on the comparison to control a device.

* * * * *